United States Patent
Yamawaku et al.

(10) Patent No.: US 9,019,505 B2
(45) Date of Patent: Apr. 28, 2015

(54) TEMPERATURE CONTROL SYSTEM INCLUDING SUB-CHILLER

(75) Inventors: Jun Yamawaku, Nirasaki (JP); Chishio Koshimizu, Nirasaki (JP); Tatsuo Matsudo, Nirasaki (JP); Kenji Nagai, Nirasaki (JP)

(73) Assignee: Tokyo Electron Limited (JP)

( * ) Notice: Subject to any disclaimer, the term of this patent is extended or adjusted under 35 U.S.C. 154(b) by 63 days.

(21) Appl. No.: 13/240,274

(22) Filed: Sep. 22, 2011

(65) Prior Publication Data
US 2012/0073781 A1 Mar. 29, 2012

Related U.S. Application Data

(60) Provisional application No. 61/391,847, filed on Oct. 11, 2010.

(30) Foreign Application Priority Data

Sep. 24, 2010 (JP) ................ 2010-214347

(51) Int. Cl.
| | | |
|---|---|---|
| G01B 9/02 | (2006.01) | |
| H01L 21/67 | (2006.01) | |
| G01J 5/58 | (2006.01) | |
| G01J 9/02 | (2006.01) | |

(52) U.S. Cl.
CPC ..... *H01L 21/67248* (2013.01); *G01J 2005/583* (2013.01); *G01J 9/02* (2013.01)

(58) Field of Classification Search
USPC ........... 356/450–521; 438/729; 165/11.1, 205
See application file for complete search history.

(56) References Cited

U.S. PATENT DOCUMENTS

| | | | |
|---|---|---|---|
| 5,660,740 A * | 8/1997 | Komino | 216/67 |
| 6,209,334 B1 * | 4/2001 | Cowans et al. | 62/224 |
| 2006/0201172 A1 * | 9/2006 | Kaneko et al. | 62/180 |
| 2006/0213763 A1 * | 9/2006 | Furuya et al. | 204/192.1 |
| 2007/0081294 A1 * | 4/2007 | Buchberger et al. | 361/234 |
| 2007/0084847 A1 * | 4/2007 | Koshimizu et al. | 219/390 |
| 2011/0284505 A1 * | 11/2011 | Ricci et al. | 219/121.54 |

FOREIGN PATENT DOCUMENTS

| | | |
|---|---|---|
| JP | 2001257253 | 9/2001 |
| JP | 2002076103 | 3/2002 |
| JP | 2002141287 | 5/2002 |
| JP | 2008-294146 | 12/2008 |
| JP | 2010199526 | 9/2010 |

* cited by examiner

*Primary Examiner* — Michael P. Stafira
*Assistant Examiner* — Michael P Lapage
(74) *Attorney, Agent, or Firm* — Cantor Colburn LLP (57) ABSTRACT

The temperature control system includes: a susceptor which allows an object to be processed to be held on a top surface thereof and includes a flow path, through which a temperature adjusting medium flows, formed therein; a temperature measuring unit which measures a temperature of the object to be processed held on the top surface of the susceptor; a first temperature adjusting unit which adjusts a temperature of the temperature adjusting medium flowing through the flow path; and a second temperature adjusting unit which is disposed between the susceptor and the first temperature adjusting unit, and adjusts a temperature of the temperature adjusting medium based on a result of the measurement of the temperature measuring unit.

4 Claims, 10 Drawing Sheets

Prior Art

FIG. 5A

Prior Art

TEMPERATURE CONTROL SYSTEM INCLUDING SUB-CHILLER

CROSS-REFERENCE TO RELATED PATENT APPLICATIONS

This application claims the benefit of Japanese Patent Application No. 2010-214347, filed on Sep. 24, 2010, in the Japan Patent Office, and U.S. Patent Application No. 61/391,847, filed on Oct. 11, 2010, in the United States Patent and Trademark Office, the disclosures of which are incorporated herein in their entireties by reference.

BACKGROUND OF THE INVENTION

1. Field of the Invention

The present invention relates to a temperature control system for controlling a temperature of an object to be processed (for example, a semiconductor wafer).

2. Description of the Related Art

It is important to manage a temperature of a semiconductor wafer during processing in order to perform high precision processing on a fine pattern of a surface of the semiconductor wafer in a semiconductor wafer processing apparatus. If the temperature of the surface of the semiconductor wafer can be optimally controlled as a process is performed, not only processing precision but also a selectivity or throughput can be improved. Currently, as the area of a semiconductor wafer has increased, radio frequency (RF) power applied to the semiconductor wafer has increased. In particular, when an insulating film is etched, high power in kilowatts is applied in order to increase an etch rate. Since impact energy of ions imparted to a semiconductor wafer is increased due to the application of the high power, a temperature of the semiconductor wafer is disadvantageously increased.

Accordingly, in a conventional temperature control system, a temperature of a susceptor is controlled by forming a flow path for a coolant in the susceptor on which a semiconductor wafer that is an object to be processed is held and flowing the coolant into the flow path. A temperature of the coolant is adjusted by a cooling apparatus or a heating apparatus in a coolant supply apparatus (for example, a chiller) to a target temperature, and then the coolant is supplied into the flow path (for example, refer to Patent Document 1).

In the conventional temperature control system, the semiconductor wafer processing apparatus and the coolant supply apparatus which is sub-equipment are generally installed away from each other (for example, the semiconductor wafer processing apparatus is installed on a second floor and the coolant supply apparatus is installed on a first floor), and a distance between the semiconductor wafer processing apparatus and the coolant supply apparatus is equal to or greater than about 10 m in many cases. As such, once the semiconductor wafer processing apparatus and the coolant supply apparatus are installed away from each other, since a time taken for the coolant whose temperature is adjusted by the coolant supply apparatus to be supplied to the susceptor in the semiconductor wafer processing apparatus is long, it is difficult to control a temperature of the semiconductor wafer in real time. Also, since the coolant is increased by an amount of the coolant circulating in pipes, overall thermal capacity is increased, and thus it is difficult to control a temperature.

[Patent Document 1] Japanese Laid-Open Patent Publication No. 2008-294146

SUMMARY OF THE INVENTION

Considering the problems of the conventional art, the present invention provides a temperature control system which can control a temperature of an object to be processed more precisely than in a conventional system.

According to an aspect of the present invention, there is provided a temperature control system including: a susceptor which allows an object to be processed to be held on a top surface thereof and includes a flow path, through which a temperature adjusting medium flows, formed therein; a temperature measuring unit, which measures a temperature of the object to be processed held on the top surface of the susceptor; a first temperature adjusting unit which adjusts a temperature of the temperature adjusting medium flowing through the flow path; and a second temperature adjusting unit which is disposed between the susceptor and the first temperature adjusting unit, and adjusts a temperature of the temperature adjusting medium based on a result of the measurement of the temperature measuring unit.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Embodiments for Carrying out the Invention

The present invention will now be described more fully with reference to the accompanying drawings, in which exemplary embodiments of the invention are shown. An outline and a configuration of a temperature control system will be explained with reference to FIGS. 1 through 3, and then embodiments of the present invention will be explained in detail. Also, in the specification and drawings, components having substantially the same functions are denoted by the same reference numerals, and a repeated explanation thereof will not be given.

Reference Example

First, an outline and a configuration of a temperature control system will be explained with reference to FIG. 1. The temperature control system shown in FIG. 1 includes a processing chamber 100 which performs etching on a semiconductor wafer W, a temperature measuring apparatus 200 which measures temperatures of the semiconductor wafer W and a focus ring (F/R), an apparatus system 300 which transmits a control signal (temperature indicating signal) based on the temperatures measured by the temperature measuring apparatus 200, and a chiller 400 which controls a temperature of a coolant (for example, brine) based on the control signal (temperature indicating signal) from the apparatus system 300.

The processing chamber 100 includes a susceptor 101, on which the semiconductor wafer W is held, and the F/R for improving etching uniformity at an end portion of the semiconductor wafer W. The susceptor 101 includes therein a flow path 101a through which the coolant (temperature adjusting medium) supplied from the chiller 400 flows. Temperatures of the semiconductor wafer W and the F/R are controlled by the coolant which flows in the flow path 101a of the susceptor 101.

The temperature measuring apparatus 200 includes a light source 210, a first splitter 220 which divides a light from the light source 210 into a measurement light for temperature measurement and a reference light, a second splitter 230 which divides the measurement light from the first splitter 220 into first through nth measurement lights (n is an integer equal to or greater than 2), a reference light reflecting unit 240 which reflects the reference light from the first splitter 220, an optical path length changing unit 250 which changes an optical path length of the reference light reflected from the reference light reflecting unit 240, a light receiving unit 260 which detects an interference waveform between reflected lights of the measurement lights and a reflected light of the reference light, and a temperature calculating unit 270 which calculates a temperature from the interference waveform detected by the light receiving unit 260.

The optical path length changing unit 250 includes, for example, a linear stage, a motor, a helium-neon (He—Ne) laser encoder, or the like for moving the reference light reflecting unit 240 that is, for example, a reference mirror, in one direction parallel to a direction in which the reference light is incident.

The light source 210 may use an arbitrary light as long as interference between a measurement light and a reference light can be measured. Also, if a temperature of the semiconductor wafer W is measured, a light whose reflected light from a distance (generally ranging from about 800 to 1500 μm) between a surface and a rear surface of the semiconductor wafer W does not cause interference may be used. Specifically, a low-coherence light may be used.

A low-coherence light refers to a light having a short coherence length. A center wavelength of a low-coherence light may range, for example, from 0.3 to 20 μm, and may range from 0.5 to 5 μm. Also, a coherence length preferably may range, for example, from 0.1 to 100 μm, and may be equal to or less than 3 μm. Since the light source 210 uses such a low-coherence light, obstruction due to unnecessary interference can be avoided, and interference with reference light based on a reflected light from the surface or an inner layer of the semiconductor wafer W can be easily measured.

Examples of a light source using a low-coherence light may include a super luminescent diode (SLD), a light-emitting diode (LED), a high luminance lamp (such as a tungsten lamp or a xenon lamp), and an ultra broadband wavelength light source. From among the light sources using a low-coherence light, an SLD having a high luminance (a wavelength of, for example, 1300 nm) may be used as the light source 210.

The first splitter 220 is, for example, an optical fiber coupler. However, the present embodiment is not limited thereto, and any device may be used as long as it can divide a light into a reference light and a measurement light. Also, the second splitter 230 is also, for example, an optical fiber coupler. However, the present embodiment is not limited thereto, and any device may be used as long as it can divide the measurement light into first through nth measurement lights. An optical waveguide type branching filter or a semi-transmissive mirror may be used as each of the first splitter 220 and the second splitter 230.

The reference light reflecting unit 240 may be, for example, a corner cube prism or a plane mirror. From among the corner cube prism and the plane mirror, considering that a reflected light is parallel to an incident light, a corner cube prism may be used. However, the present embodiment is not limited thereto, and the reference light reflecting unit 240 may be a delay line as long as the delay line can reflect a reference light.

Considering low cost and compact design, the light receiving unit 260 may include, for example, an image sensor. Specifically, the light receiving unit 260 may include an image sensor using, for example, a silicon (Si) photodiode, an InGaAs photodiode, or a germanium (Ge) photodiode. Also, if a temperature of the semiconductor wafer W is measured, since a light having a center wavelength equal to or greater than 1000 nm is used, the light receiving unit 260 may include an image sensor using an InGaAs photodiode which has sensitivity to a light having a wavelength of 800 to 1700 nm.

The reference light from the first splitter 220 is transmitted to a reference light emission position, from which the reference light is emitted to the reference light reflecting unit 240, through a reference light transmitting unit, for example, a collimator fiber, and the first through nth measurement lights from the second splitter 230 are transmitted to measurement light emission positions, from which the first through nth measurement lights are emitted to the semiconductor wafer W and the F/R, respectively through first through nth measurement light transmitting units, for example, collimator fibers $F_1$ through $F_n$. Also, the first through nth measurement light transmitting units are not limited to the collimator fibers $F_1$ through $F_n$, and optical fibers obtained by attaching collimators to front ends of optical fibers may be used.

(Optical Path Lengths of First Through Nth Measurement Lights)

The temperature measuring apparatus 200 is configured such that optical path lengths of the first through nth measurement lights between the second splitter 230 to the semiconductor wafer W are different from one another. In detail, if lengths of the collimator fibers $F_1$ through $F_n$ are the same, for example, front end surfaces of the collimator fibers $F_1$ through $F_n$, that is, the measurement light emission positions, are arranged in a misaligned manner in a direction substantially parallel to an emission direction from the semiconductor wafer W and the F/R. Also, without misaligning the front end surfaces of the collimator fibers $F_1$ through $F_n$, optical path lengths of the first through nth measurement lights between the second splitter 230 and the semiconductor wafer W and the F/R may be different from one another by getting lengths of the collimator fibers $F_1$ through $F_n$ or lengths of the optical fibers different from one another.

Also, if the first through nth measurement light transmitting units are arranged in a misaligned manner from the semiconductor wafer W and the F/R, it is necessary at least to prevent interference waves between the first through nth measurement lights measured at measurement points and the reference light from overlapping with one another. For example, if the light source 210 is a low-coherence light source, interference waves can be prevented from overlapping with one another by arranging the first through nth measurement transmitting units such that the measurement transmitting units are misaligned from one another with respect to the semiconductor wafer W and the F/R by at least coherence lengths or more of the interference waves.

Also, positions of the first through nth measurement light transmitting units may be determined in consideration of a thickness or a rate of change of thickness of the semiconductor wafer W, a measured temperature range, a movement distance of a reference mirror, or the like. In detail, in the case of a silicon wafer having a thickness of, for example, about 0.7 mm, since a movement distance of a reference mirror in a temperature range from a room temperature to about 200° C. is about 0.04 mm, the first through nth measurement light transmitting units may be arranged such that the measurement light transmitting units are misaligned from one another with respect to the semiconductor wafer W and the F/R by about 0.1 mm. Accordingly, interference waves at measurement points can be prevented from overlapping with one another.

Accordingly, interference waves at measurement points to which the first through nth measurement lights are emitted can be detected at once by scanning the reference light reflecting unit 240 only once. Accordingly, a time taken to measure a temperature can be minimized.

(Operation of Temperature Measuring Apparatus)

Figure 1:
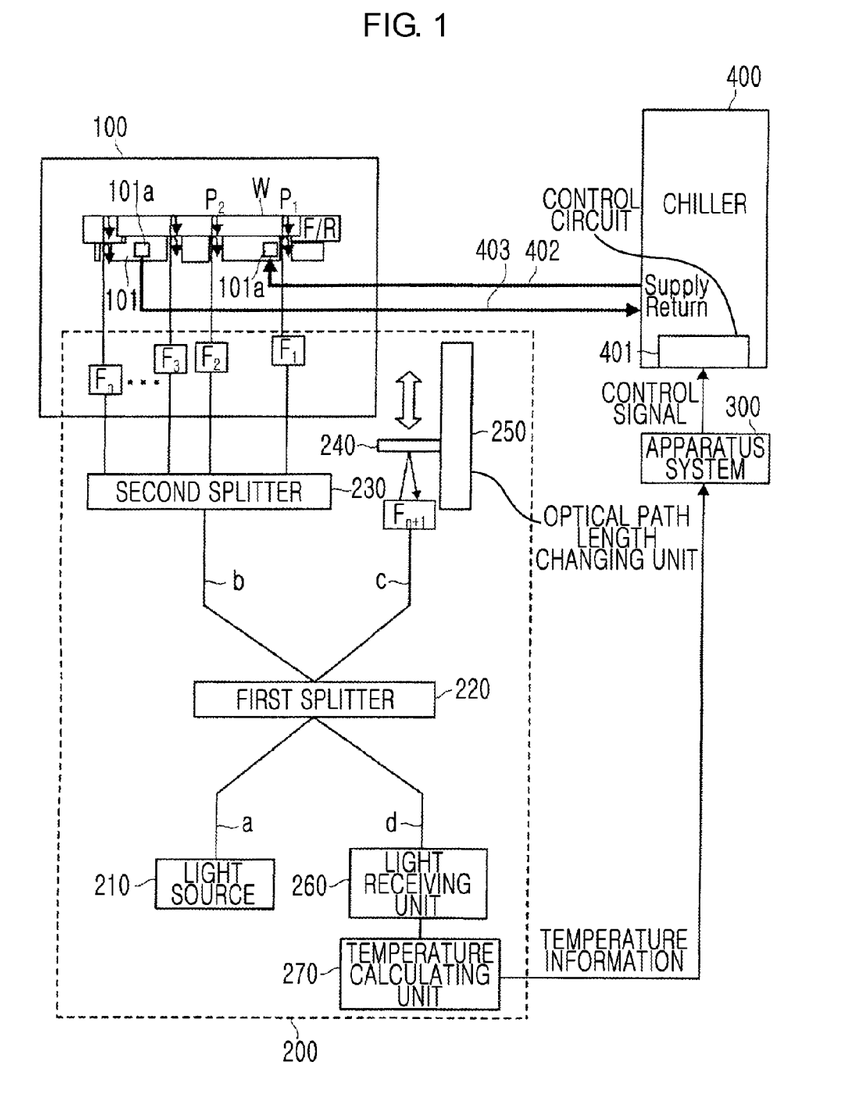
FIG. 1 is a diagram showing a configuration of a temperature control system according to a reference example.

In the temperature measuring apparatus 200 shown in FIG. 1, a light from the light source 210 is incident on a terminal a of the first splitter 220, wavelength-divided by the first splitter 220, and sent to a terminal b and a terminal c by the first splitter 220. From among lights from the terminal b and the second terminal c, the light (measurement light) from the terminal b is incident on the second splitter 230, and is wavelength-divided into first through nth measurement lights by the second splitter 230. The first through nth measurement lights are respectively emitted through the collimator fibers $F_1$ through $F_n$, and are reflected from the semiconductor wafer W and the F/R.

Meanwhile, the light (reference light) from the terminal c is emitted from the collimator fiber $F_{n+1}$, and is reflected by the reference light reflecting unit (for example, a reference mirror) 240. Also, reflected lights of the first through nth measurement lights are incident on the first splitter 220 through the second splitter 230 and are wavelength-combined with a reflected light of the reference light, and an interference waveform is detected by the light receiving unit 260 which uses, for example, a Si photodiode, an InGaAs photodiode, or a Ge photodiode.

(Specific Example of Interference Waveform Between Measurement Light and Reference Light)

Figure 2A:
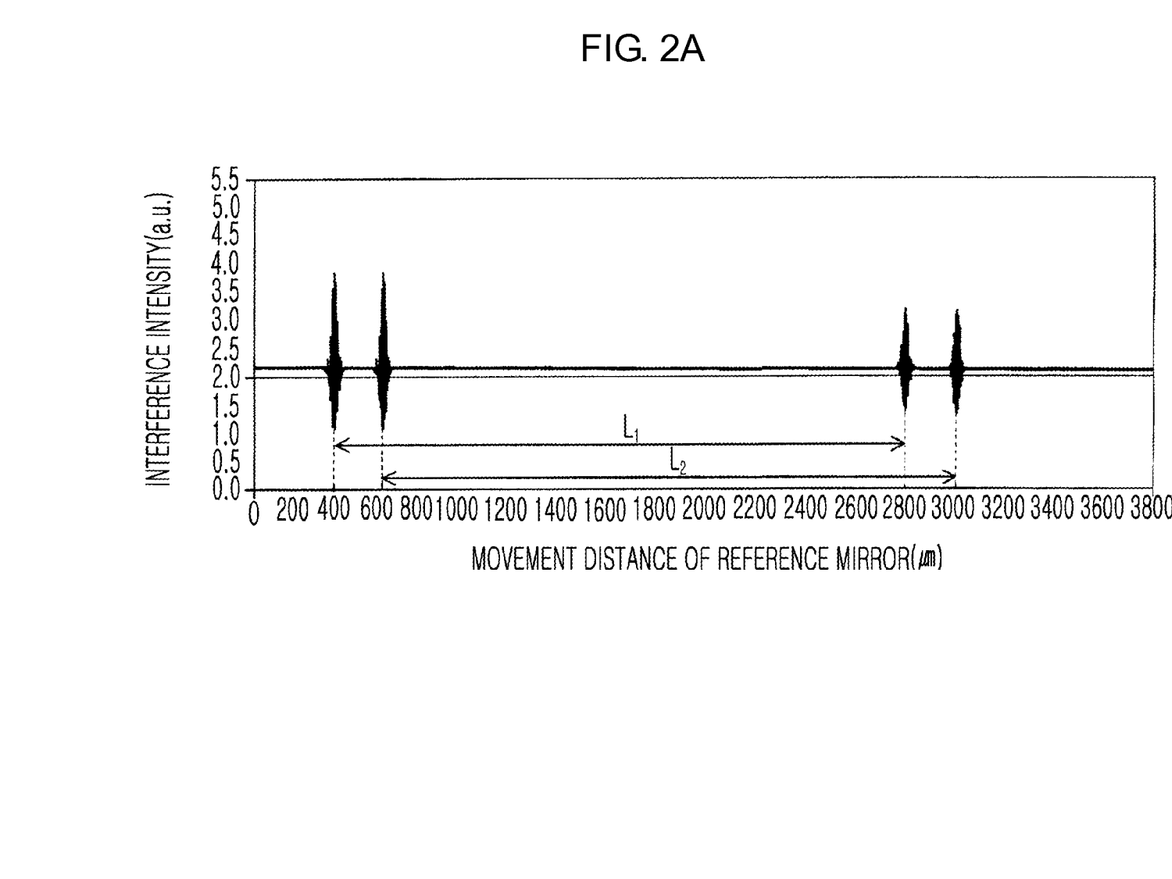
FIGS. 2A and 2B are graphs showing a specific example of an interference waveform.
Figure 2B:
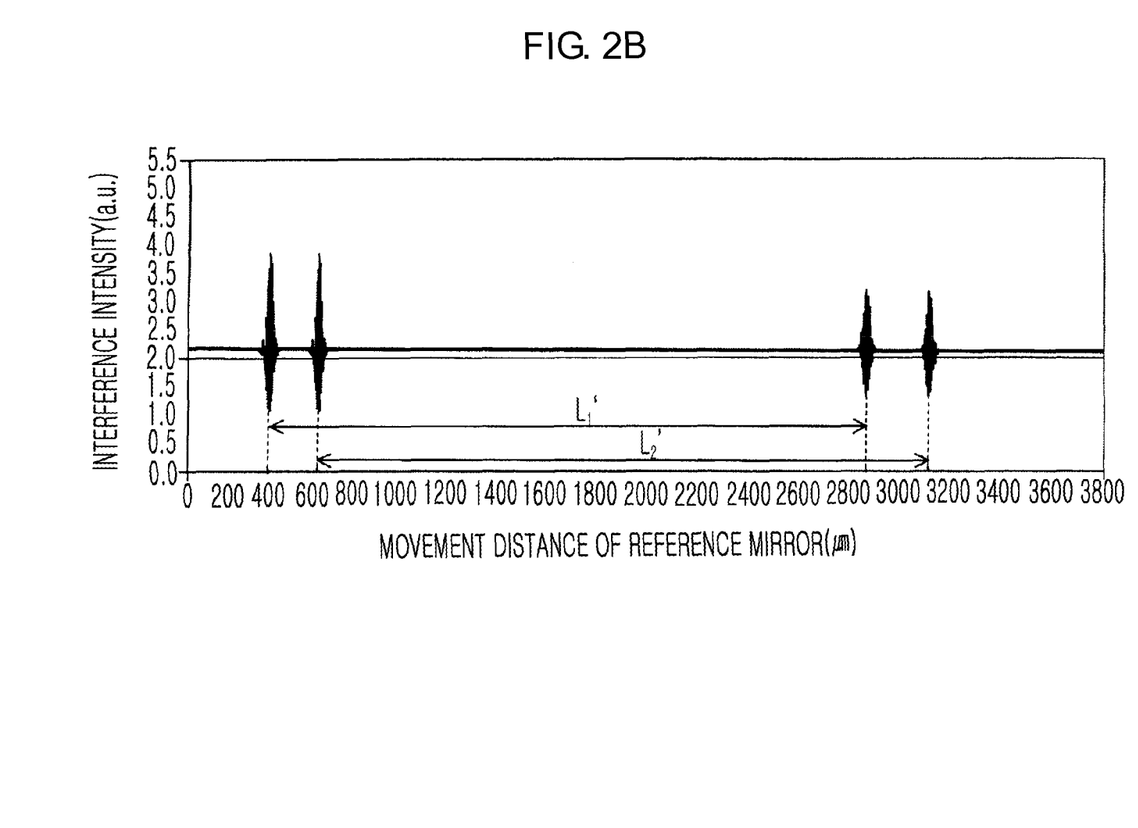

Here, a specific example of an interference waveform obtained by the light receiving unit 260 of the temperature measuring apparatus 200 is shown in FIGS. 2A and 2B. FIGS. 2A and 2B show an interference waveform between first and second measurement lights and a reference light when the first and second measurement lights obtained by the second splitter 230 are respectively emitted to a measurement point P1 (for example, an edge of the semiconductor wafer W) and a measurement point P2 (for example, a center of the semiconductor wafer W) within a surface of the semiconductor wafer W. FIG. 2A shows an interference waveform before a temperature change, and FIG. 2B shows an interference waveform after the temperature change. In FIGS. 2A and 2B, a vertical axis represents interference intensity and a horizontal axis represents a movement distance of a reference mirror.

Also, the light source 210 is a low-coherence light source as described above. If the light source 210 is a low-coherence light source, since a coherence length of a light from the light source 210 is short, an interference intensity is high at a place where an optical path length of a measurement light and an optical path length of a reference light are the same and an interference intensity is substantially low at other places, in general. Accordingly, by driving the reference light reflecting unit (for example, a reference mirror) 240 in, for example, an emission direction in which the reference light is emitted in order to change an optical path length of the reference light, if there is a layer in the wafer in addition to the surface and the rear surface of the semiconductor wafer W, interference between a reflected light of the measurement light from the layer and the reference light occurs due to a refractive index difference between the surface, the rear surface and the layer of the semiconductor wafer W. As a result, a temperature in a depth direction of the semiconductor wafer W can be measured.

Referring to FIGS. 2A and 2B, when the reference light reflecting unit (for example, a reference mirror) 240 is scanned in one direction, an interference wave occurs between a surface of the measurement point $P_1$ of the semiconductor wafer W and the reference light, and then an interference wave occurs between a surface of the measurement point $P_2$ and the reference light. When the reference light reflecting unit 240 is further scanned, an interference wave occurs between a rear surface of the measurement point P1 of the semiconductor wafer W and the reference light, and then an interference wave occurs between a rear surface of the measurement point P2 and the reference light. As such, interference waves of the surfaces and the rear surfaces of the measurement points P1 and P2 to which the first and second measurement lights are emitted can be detected at once by scanning the reference light reflecting unit 240 only once.

(Temperature Measuring Method Based on Interference Light)

Next, a method of measuring a temperature based on an interference wave between a measurement light and a reference light in the temperature calculating unit 270 will be explained. A temperature measuring method based on an interference wave is, for example, a temperature converting method which uses an optical path length change based on a temperature change. Here, a temperature converting method using a misalignment of the interference waveform will be explained.

When etching starts (and plasma is generated), ions collide with the semiconductor wafer W and the F/R and temperatures of the semiconductor wafer W and the F/R are increased. Once the temperatures are increased, since the semiconductor wafer W and the F/R are expanded and refractive indices of the semiconductor wafer W and the F/R are changed, there is a misalignment of an interference waveform between before a temperature change and after the temperature change, and thus a width between peaks of the interference waveform is changed. At this time, when a temperature change occurs at each measurement point, there occurs a misalignment of an interference waveform at each measurement point and a width between peaks of the interference waveform is changed. The temperature change can be detected by measuring the width between the peaks of the interference waveform at each measurement point. For example, in the temperature measuring apparatus 200 shown in FIG. 1, since a width between peaks of an interference waveform corresponds to a movement distance of the reference light reflecting unit 240, a temperature change can be detected by measuring the movement distance of the reference light reflecting unit 240 corresponding to the width between the peaks of the interference waveform.

If a thickness and a refractive index of the semiconductor wafer W are respectively d and n, a misalignment of a peak in an interference waveform is dependent on a unique linear expansion coefficient α of each layer for the thickness d, and is dependent mainly on a unique temperature coefficient β of refractive index change of each layer for the refractive index n. It is known that the misalignment of the peak is also dependent on a wavelength for the temperature coefficient β of refractive index change.

Accordingly, a thickness d' and a refractive index n' of a wafer after a temperature change at a certain measurement point P may be defined as shown in Equation 1. Also, in Equation 1, ΔT denotes an amount of temperature change of the measurement point, α denotes a linear expansion coefficient, and β denotes a temperature coefficient of refractive index change. Also, d and n respectively denote a thickness and a refractive index at the measurement point P before the temperature change.

[Equation 1]

$$d' = d \cdot (1 + \alpha \Delta T), n' = n \cdot (1 + \beta \Delta T) \quad (1)$$

As shown in Equation 1, an optical path length of a measurement light which passes through the measurement point P varies according to the temperature change. An optical path length is generally obtained by multiplying the thickness d by the refractive index n. Accordingly, if an optical path length of a measurement light which passes through the measurement point P before a temperature change is L and an optical path length after a temperature of the measurement point P is changed by ΔT is L', the optical path lengths L and L' are defined as shown in Equation 2.

[Equation 2]

$$L = d \cdot n, L' = d' \cdot n' \quad (2)$$

Accordingly, a difference (L'−L) between the optical path length L before the temperature change and the optical path length L' after the temperature change at the measurement point is defined as shown in Equation 3 by referring to Equations 1 and 2. Also, in Equation 3, small terms are omitted in consideration of $\alpha \cdot \beta \ll \alpha$, $\alpha \cdot \beta \ll \beta$.

$$\begin{aligned} L' - L &= d' \cdot n' - d \cdot n \quad \text{[Equation 3]} \\ &= d \cdot n \cdot (\alpha + \beta) \cdot \Delta T \\ &= L \cdot (\alpha + \beta) \cdot \Delta T \end{aligned}$$

Here, an optical path length of a measurement light at a measurement point corresponds to a width between peaks of an interference waveform with a reference light. Accordingly, if a linear expansion coefficient α and a temperature coefficient β of refractive index change are obtained in advance, a width between peaks of an interference waveform with a reference light at a measurement point can be measured and can be converted to a temperature of the measurement point by using Equation 3.

As such, if a temperature is converted from an interference wave, since an optical path length between peaks of an interference waveform varies according to a linear expansion coefficient α and a temperature coefficient β of refractive index change as described above, the linear expansion coefficient α and a temperature coefficient β of refractive index change need to be obtained in advance. A linear expansion coefficient α and a temperature coefficient β of refractive index change of a material including a semiconductor wafer may be generally dependent on a temperature in a certain temperature range. For example, in general, since a linear expansion coefficient α is not much changed when a temperature ranges from 0 to 100° C., the linear expansion coefficient α may be regarded as constant. However, since there is a material whose linear expansion coefficient α increases as a temperature increases when a temperature is equal to or higher than 100° C., a temperature dependency of the linear expansion coefficient α cannot be disregarded in this case. Likewise, there are cases where a temperature dependency of a temperature coefficient β of refractive index change cannot be disregarded in a certain temperature range.

For example, it is known that a linear expansion coefficient α and a temperature coefficient β of refractive index change of Si constituting a semiconductor wafer approximate to, for example, a quadratic curve in a temperature range of 0 to 500° C. As such, since a linear expansion coefficient α and a temperature coefficient β of refractive index change are dependent on temperature, a temperature can be more accurately calculated by obtaining a linear expansion coefficient α and a temperature coefficient β of refractive index change according to temperature in advance and obtaining a temperature in consideration of the obtained linear expansion coefficient α and temperature coefficient β of refractive index change.

Also, a temperature measuring method based on an interference wave between a measurement light and a reference light is not limited to the above-described method, and for example, a method using an absorbance intensity change based on a temperature change may be used or a method which combines an optical path length change based on a temperature change and an absorbance intensity change based on a temperature change may be used.

The apparatus system 300 receives temperatures of the semiconductor wafer W and the F/R measured by the temperature measuring apparatus 200 in real time, and transmits a control signal (temperature indicating signal) to the chiller 400 based on the received temperatures of the semiconductor wafer W and the F/R. In detail, a setting temperature of the chiller 400 is controlled such that the received temperatures of the semiconductor wafer W and the F/R are constant.

The chiller 400 includes a control circuit 401 which controls a temperature of a coolant based on the control signal (temperature indicating signal) from the apparatus system 300, a flow path (forward path) 402 through which the coolant is supplied to the susceptor 101, and a flow path (return path) 403 through which the coolant from the susceptor 101 is returned to the chiller 400. The control circuit 401 may control a temperature of the coolant based on the control signal (temperature indicating signal) transmitted from the apparatus system 300 by using, for example, a proportional-integral-derivative (PID) control method. The PID control method, which is a type of feedback control method, controls an input value by using three parameters, that is, a difference between an output value and a desired value, an integral value, and a differential value. Also, various control methods other than the PID control method may be used as long as they can maintain temperatures of the semiconductor wafer W and the F/R constant.

Figure 3:
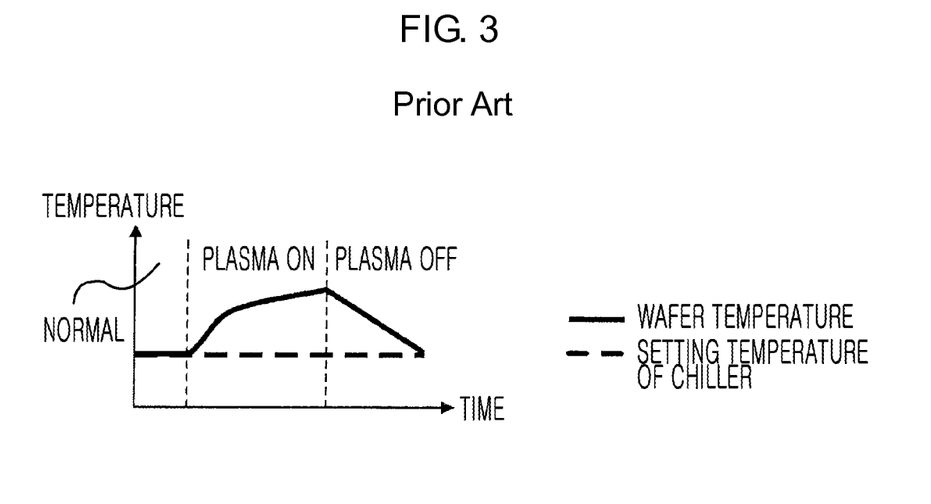
FIG. 3 is a graph showing a relationship between a semiconductor wafer temperature and a chiller setting temperature.

FIG. 3 is a graph showing a relationship between a temperature of the semiconductor wafer W and a setting temperature of the chiller 400. FIG. 3 shows a relationship between a temperature of the semiconductor wafer W and a setting temperature of the chiller 400 in the conventional art (when the setting temperature of the chiller 400 is constant). In FIG. 3, a vertical axis represents a temperature of the semiconductor wafer W and a horizontal axis represents a process time. Also, a temperature of the semiconductor wafer W is marked by a solid line and a setting temperature of the chiller 400 is marked by a dashed line. When a temperature setting of the chiller 400 is constant irrespective of a temperature of the semiconductor wafer W as in the conventional art, since the setting temperature of the chiller 400 is not changed during a process of the semiconductor wafer W as shown in FIG. 3, a temperature of the semiconductor wafer W during the process is changed.

First Embodiment

Figure 4:
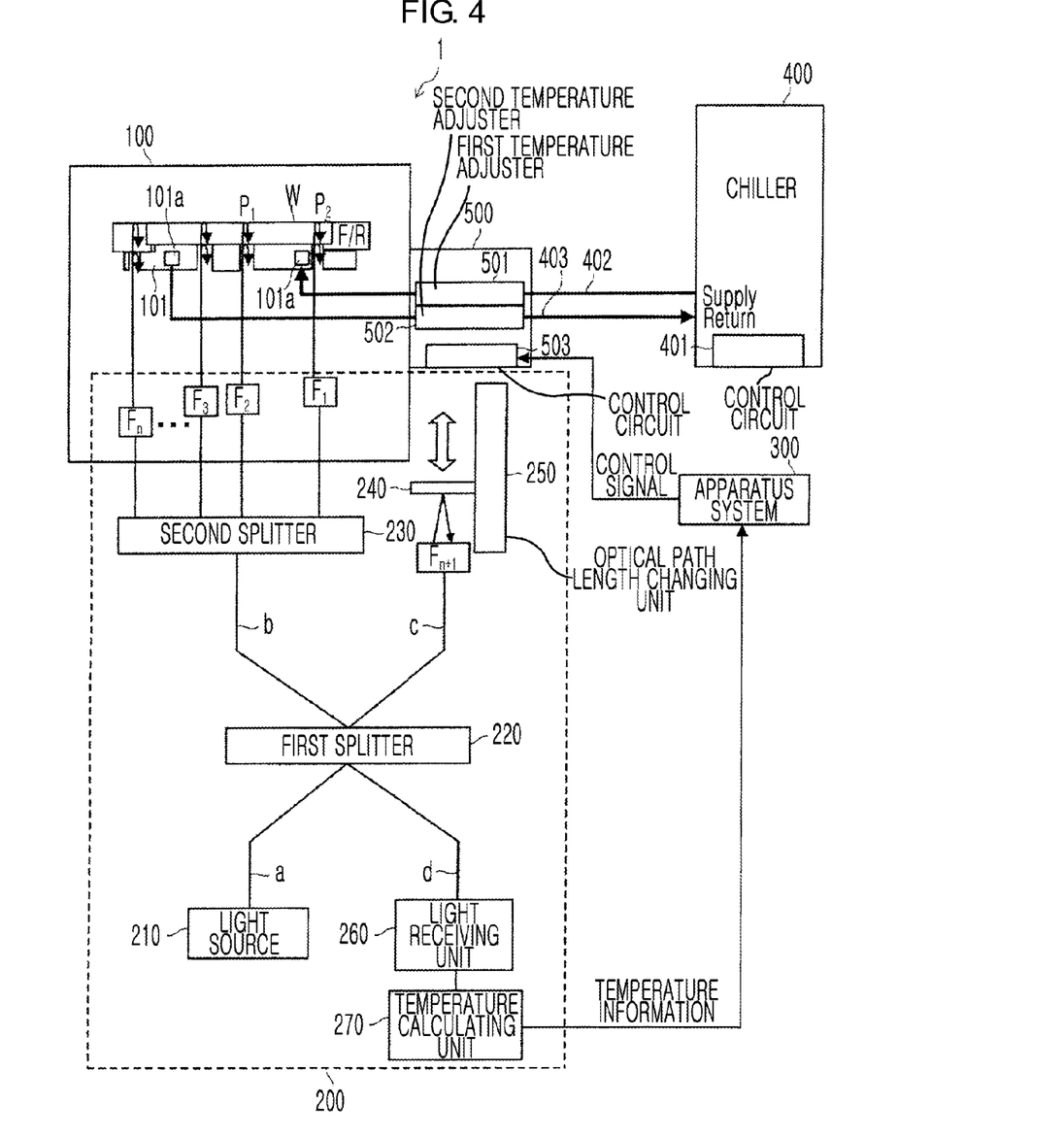
FIG. 4 is a diagram showing a configuration of a temperature control system according to a first embodiment.

FIG. 4 is a diagram showing a configuration of a temperature control system 1 according to a first embodiment. The temperature control system 1 according to the first embodiment is different from the temperature control system shown in FIG. 1 in that a sub chiller 500 (second temperature adjusting unit) independent from the chiller 400 is additionally disposed between the chiller 400 (first temperature adjusting unit) and the susceptor 101 included in the processing chamber 100. When the temperature control system 1 according to the first embodiment is explained with reference to FIG. 4, components having substantially the same functions as those described in FIG. 1 are denoted by the same reference numerals, and a repeated explanation thereof will not be given.

The sub chiller 500 includes a first temperature adjuster 501 which adjusts a temperature of a coolant flowing through the flow path (forward path) 402, a second temperature adjuster 502 which adjusts a temperature of the coolant flowing through the flow path (return path) 403, and a control circuit 503 which controls the first temperature adjuster 501 and the second temperature adjuster 502 based on a control signal (temperature indicating signal) from the apparatus system 300.

The control circuit 503 may control a temperature of the coolant based on the control signal (temperature indicating signal) transmitted from the apparatus system 300 by using, for example, a PID control method. Also, various control methods other than the PID control method may be used as long as they can maintain a temperature of the semiconductor wafer W constant. Also, the control circuit 503 controls the first temperature adjuster 501 and the second temperature adjuster 502, the first temperature adjuster 501 and the second temperature adjuster 502 being independent from each other.

As described above, since, in general, the processing chamber 100 is often installed on a second floor of a semiconductor manufacturing facility and the chiller 400 which is sub-equipment is often installed on a first floor, time lag for the coolant whose temperature is adjusted by the chiller 400 to be supplied to the susceptor 101 in the processing chamber 100 occurs. Accordingly, it is difficult to control a temperature of the semiconductor wafer W in real time. Accordingly, in the first embodiment, responsiveness of the semiconductor wafer W to temperature control can be improved by disposing the sub chiller 500 between the processing chamber 100 and the chiller 400 and adjusting a temperature of the coolant flowing through the flow path (forward path) 402 and the first temperature adjuster 501 included in the sub chiller 500.

Also, although the chiller 400 continuously supplies the coolant whose temperature is adjusted to the susceptor 101 in order to stabilize a temperature of the semiconductor wafer W, once a process starts, a temperature of the coolant is increased and it takes time to reduce the increased temperature of the coolant. Accordingly, in the present embodiment, a time taken to adjust a temperature of the coolant to a desired temperature by using the chiller 400 is reduced by providing the second temperature adjuster 502 for adjusting a temperature of the coolant flowing through the flow path (return path) 403 in the sub chiller 500 and adjusting (reducing) the temperature of the coolant to some degree in advance. As a result, responsiveness of the semiconductor wafer W to temperature control can be improved.

Figure 5A:
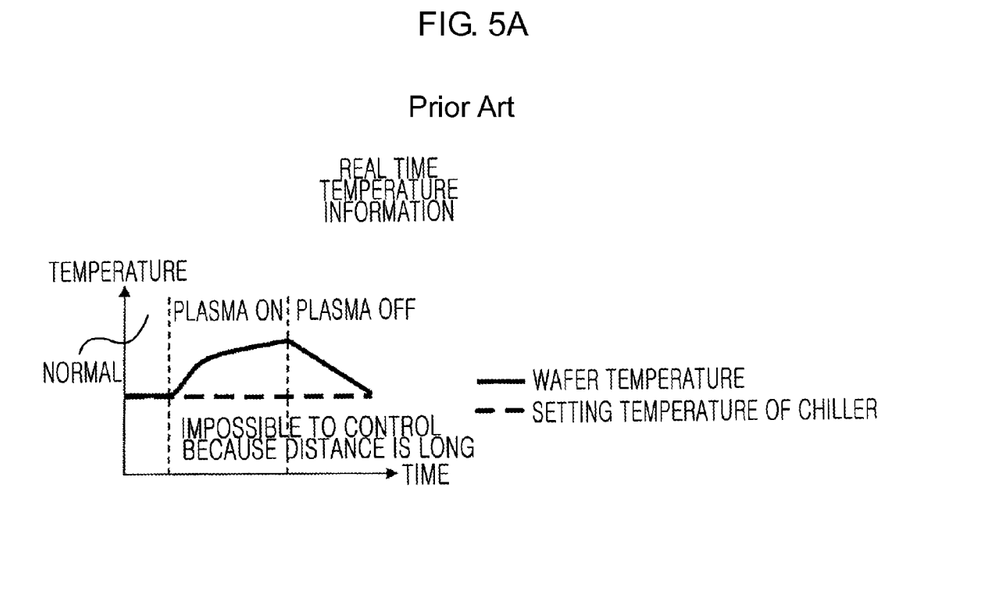
FIGS. 5A and 5B are graphs showing a relationship between a semiconductor wafer temperature and a chiller setting temperature.
Figure 5B:
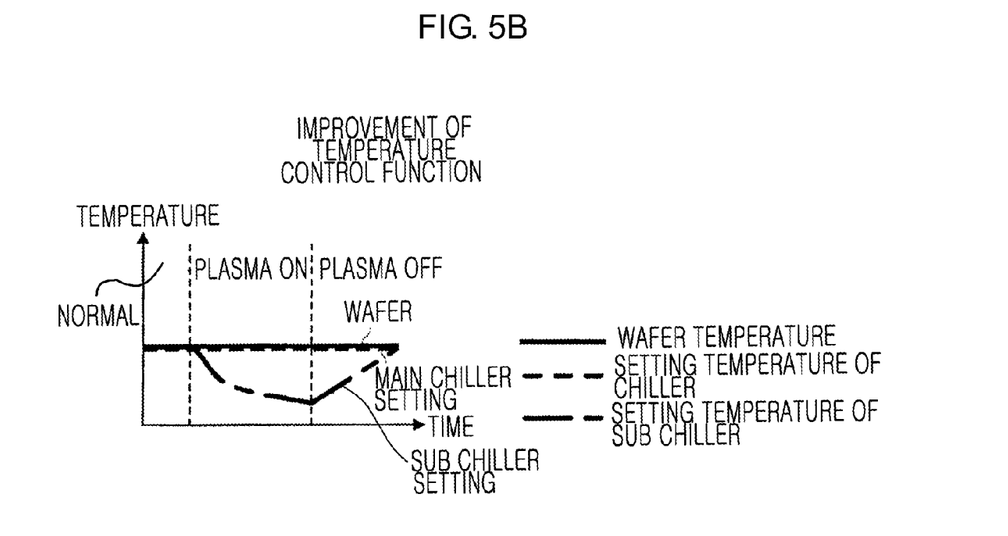

FIGS. 5A and 5B are graphs showing a relationship between a temperature of the semiconductor wafer W and a temperature of the coolant in the susceptor 101. FIG. 5A shows a relationship between a temperature of the semiconductor wafer W and a setting temperature of the chiller 400 in the conventional art (when the setting temperature of the chiller 400 is constant). FIG. 5B shows a relationship between a temperature of the semiconductor wafer W, a setting temperature of the chiller 400, and a setting temperature of the sub chiller 500 when the sub chiller 500 is included and the setting temperature of the sub chiller 500 varies according to the temperature of the semiconductor wafer W measured by the temperature measuring apparatus 200. Also, in FIGS. 5A and 5B, a vertical axis represents a temperature of the semiconductor wafer W and a horizontal axis represents a process time. Also, in FIGS. 5A and 5B, a temperature of the semiconductor wafer W is marked by a solid line, a setting temperature of the chiller 400 is marked by a dashed line, and a setting temperature of the sub chiller 500 is marked by a dotted dashed line.

When a setting temperature of the chiller 400 is constant, the setting temperature of the chiller 400 is not changed during a process of the semiconductor wafer W. Also, time lag for the coolant whose temperature is adjusted by the chiller 400 to be supplied to the susceptor 101 in the processing chamber 100 occurs. Accordingly, as shown in FIG. 5A, a temperature of the coolant supplied to the susceptor 101 is not changed and a temperature of the semiconductor wafer W during a process is changed.

Meanwhile, in the present embodiment, the sub chiller 500 is disposed close to the susceptor 101, and a setting temperature of the sub chiller 500 is controlled based on a temperature of the semiconductor wafer W measured in real time. Also, since a distance between the sub chiller 500 and the processing chamber 100 is short, time lag for the coolant whose temperature is adjusted by the first temperature adjuster 501 to be supplied to the susceptor 101 in the processing chamber 100 hardly occurs. Accordingly, as shown in FIG. 5B, a temperature of the semiconductor wafer W is prevented from being changed, and a temperature of the semiconductor wafer W can be maintained substantially constant.

Also, a position of the sub chiller 500 may be close to the susceptor 101 in the processing chamber 100. Although a distance between the susceptor 101 and the sub chiller 500 is dependent on a flow velocity and a flow rate of the coolant flowing through the flow path (forward path) 402 and the flow path (return path) 403, the distance may be less than 2 mm.

As described above, since the temperature control system 1 according to the first embodiment additionally includes the sub chiller 500, which is independent from the chiller 400 and disposed between the chiller 400 and the susceptor 101 included in the processing chamber 100, and a temperature of the coolant flowing through the flow path (forward path) 402 and the flow path (return path) 403 close to the processing chamber 100 is adjusted while monitoring a temperature change of the semiconductor wafer W and the F/R during a process, the temperature change of the semiconductor wafer W and the F/R can be prevented and processing precision of the semiconductor wafer W can be improved.

Modified Example of First Embodiment

In the first embodiment, temperatures of the semiconductor wafer W and the F/R are measured by dividing a light generated by the light source 210 into a measurement light and a reference light, and causing the measurement light reflected by a measurement point of the semiconductor wafer W and the reference light reflected by the reference light reflecting unit 240 to interfere with each other. In a modified example of the first embodiment, temperatures of the semiconductor wafer W and the F/R are measured without using the reference light.

Figure 6:
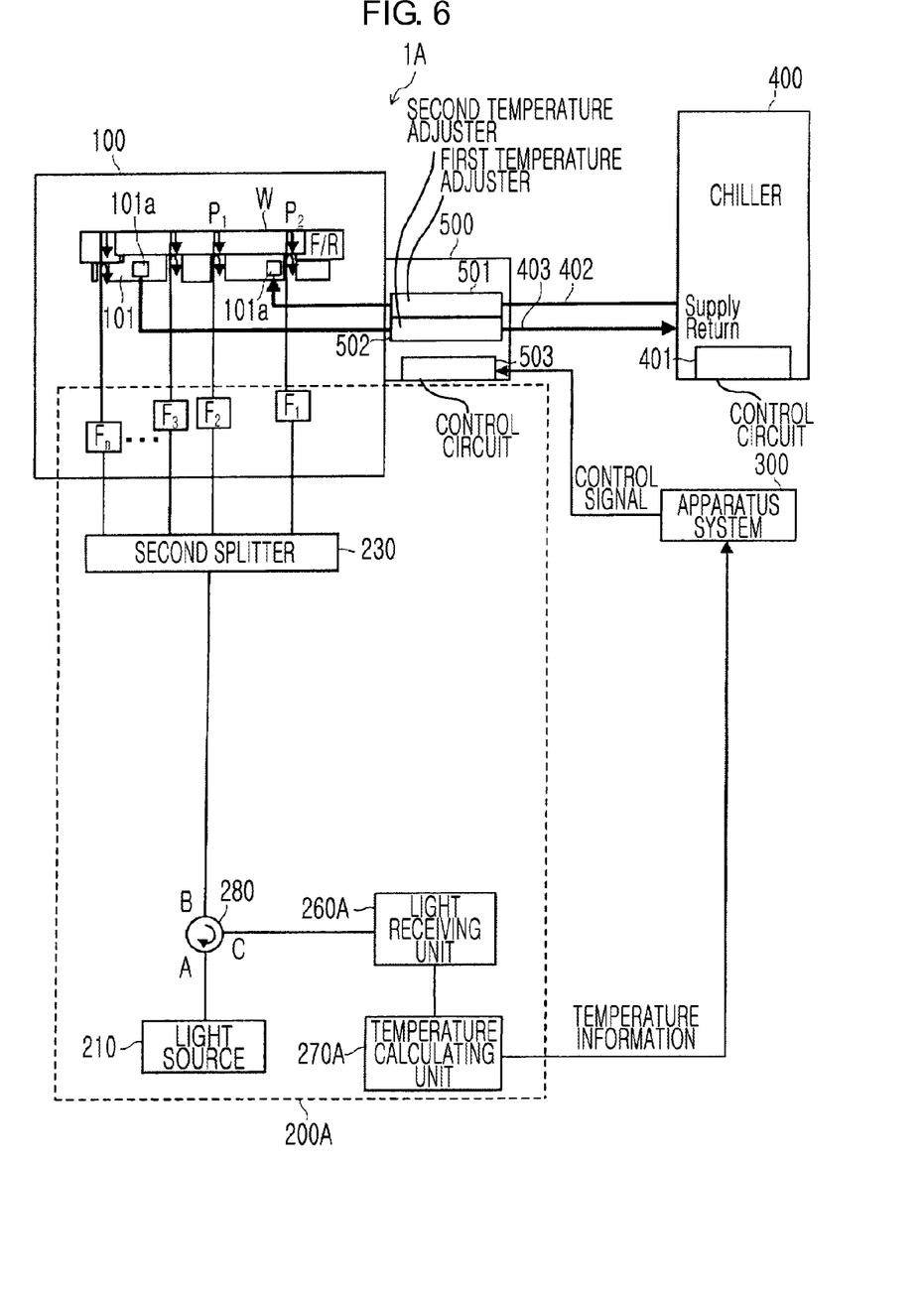
FIG. 6 is a diagram showing a configuration of a temperature control system according to a modified example of the first embodiment.

FIG. 6 is a diagram showing a configuration of a temperature measuring system 1A according to the modified example of the first embodiment. The temperature measuring system 1A is different from the temperature control apparatus 1 according to the first embodiment in that a temperature measuring apparatus 200A instead of the temperature measuring apparatus 200 is included.

The temperature measuring apparatus 200A includes the light source 210, an optical circulator 280 which inputs a light from the light source 210 to the second splitter 230 and inputs a reflected light from the second splitter 230 to a light receiving unit 260A, the second splitter 230 which divides a measurement light from the optical circulator 280 into first through nth measurement lights (n is an integer greater than 2), the light receiving unit 260A which generates a discrete signal by transforming a reflected light input from the optical circulator 280 to show a plurality of wavelengths, and a temperature calculating unit 270A which calculates an optical path length by performing discrete Fourier transformation (DFT) on the discrete signal from the light receiving unit 260A and calculates temperatures of the semiconductor wafer W and the F/R based on the optical path length. When components included in the temperature measuring apparatus 200A are explained below, the same components as those described in FIGS. 1 and 2 are denoted by the same reference numerals and a detailed explanation thereof will not be given.

The optical circulator 280 includes three ports A through C. A light input to the port A is output from the port B, a light input to the port B is output from the port C, and a light input to the port C is output from the port A. That is, a measurement light from the light source 210 input to the port A of the optical circulator 280 is input to the second splitter 230 through the port B of the optical circulator 280, and reflected lights from the semiconductor wafer W and the F/R input to the port B of the optical circulator 280 are input to the light receiving unit 260A through the port C of the optical circulator 280.

Figure 7:
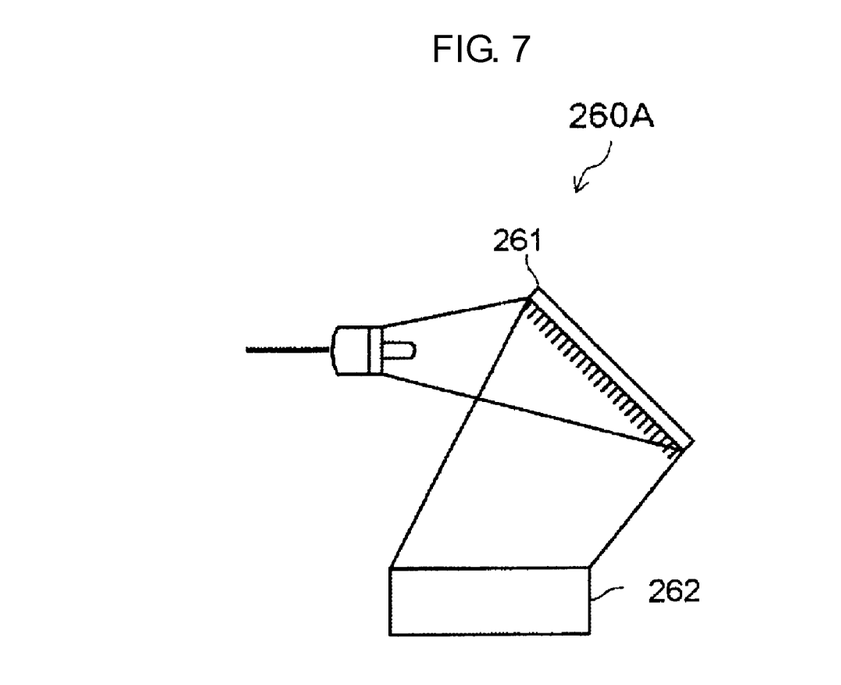
FIG. 7 is a diagram showing a configuration of a light receiving unit.

FIG. 7 is a diagram showing a configuration of the light receiving unit 260A. The light receiving unit 260A includes a diffraction grating 261 which wavelength-resolves a reflected light from the optical circulator 280 and an image sensor 262 which converts the wavelength-resolved reflected light to an electrical signal, and generates a discrete signal by transforming the reflected light from the optical circulator 280 to show a plurality of wavelengths and outputs the discrete signal. Also, the image sensor 262 is an image sensor using, for example, a Si photodiode, an InGaAs photodiode, or a Ge photodiode. If a temperature of the semiconductor wafer W is measured, the InGaAs photodiode may be used.

Figure 8:
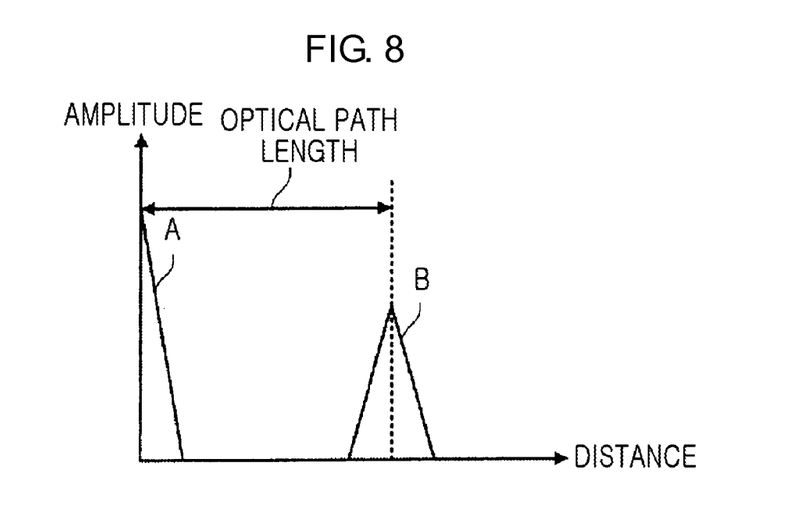
FIG. 8 is a diagram showing a signal after discrete Fourier transformation (DFT)

The temperature calculating unit 270A is, for example, a computer, and calculates temperatures of the semiconductor wafer W and the F/R based on the discrete signal input from the light receiving unit 260A. The temperature calculating unit 270A receives the discrete signal from the light receiving unit 260A and performs DFT. Due to the DFT, the discrete signal from the light receiving unit 260A is converted to information regarding an amplitude and a distance. FIG. 8 is a diagram showing a signal after DFT. In FIG. 8, a vertical axis represents amplitude and a horizontal axis represents a distance.

The temperature calculating unit 270A calculates an optical path length based on the information regarding the amplitude and the distance obtained due to the DFT. In detail, a distance between a peak A and a peak B shown in FIG. 8 is calculated. The peak A and the peak B shown in FIG. 8 are caused by interference between a reflected light from a surface and a reflected light from a rear surface of the semiconductor wafer W, and a difference in the optical path length is dependent on a temperature of the semiconductor wafer W. This is because when a temperature of the semiconductor wafer W is changed, due to changes in the thermal expansion and refractive index of the semiconductor wafer W and the F/R, optical path lengths between the surfaces and the rear surfaces of the semiconductor wafer W and F/R are changed.

The temperature calculating unit 270A calculates a temperature of the semiconductor wafer W by using the optical path length based on a relationship between an optical path length and a temperature, and outputs the temperature as temperature information to the apparatus system 300. Also, the relationship between the optical path length and the temperature is previously stored in a nonvolatile memory such as a hard disk drive (HDD), a flash memory, or a ferroelectric random-access memory (FeRAM) included in the temperature calculating unit 270A.

As described above, since the temperature measuring system 1A according to the modified example of the first embodiment converts a reflected light from the semiconductor wafer W to a discrete signal by the light receiving unit 260A and calculates an optical path length by performing DFT on the discrete signal, the reference light reflecting unit 240 does not need to be mechanically operated by using the optical path length changing unit 250. Accordingly, temperatures of the semiconductor wafer W and the F/R can be very rapidly measured and thus a temperature change of the semiconductor wafer W can be more effectively prevented. Other effects are the same as those of the temperature measuring system 1 according to the first embodiment.

Second Embodiment

Figure 9:
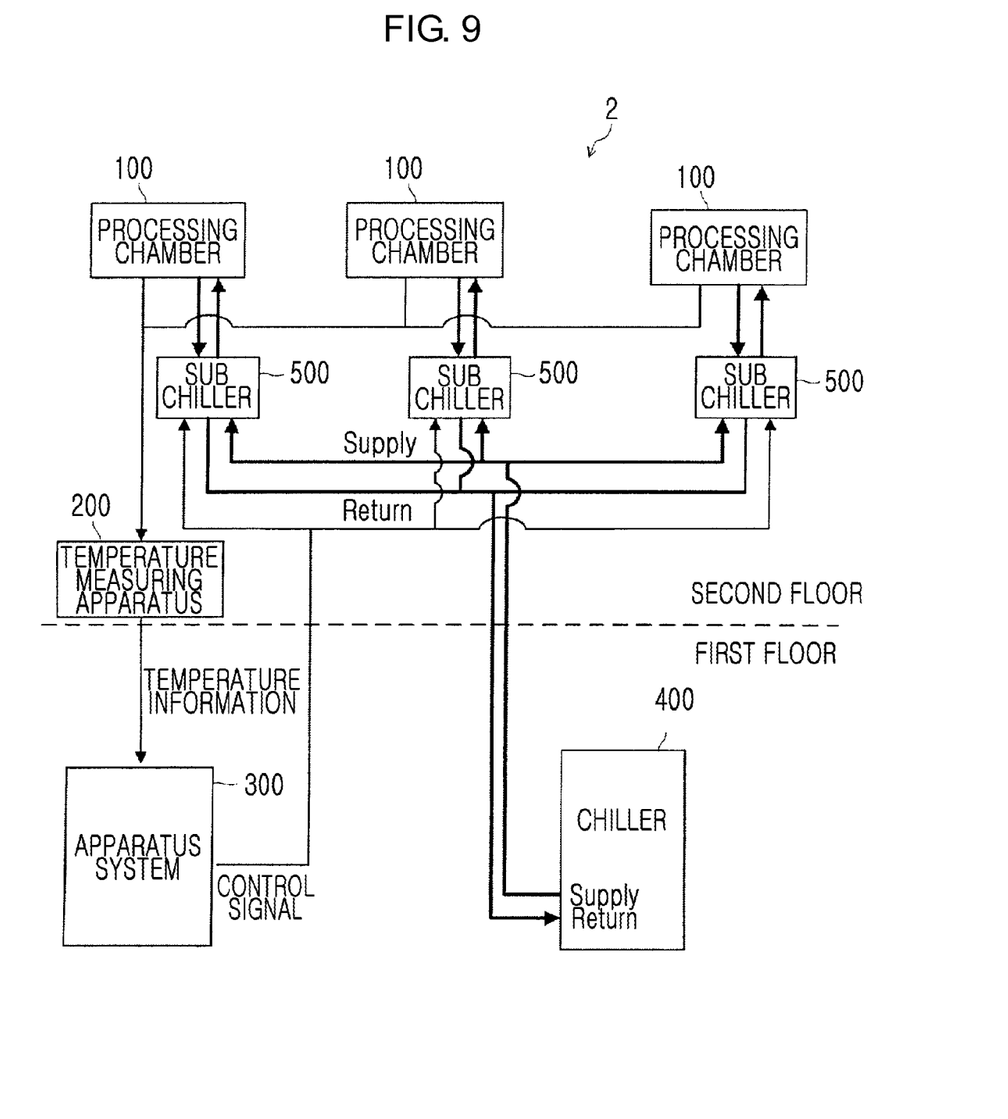
FIG. 9 is a diagram showing a configuration of a temperature control system according to a second embodiment.

FIG. 9 is a diagram showing a configuration of a temperature control system 2 according to a second embodiment. Currently, a multi-chamber method, where a plurality of processing chambers are provided in one semiconductor manufacturing apparatus, is mainly used in a semiconductor manufacturing apparatus for processing a 300 mm wafer. In the second embodiment, the present invention is applied to such a multi-chamber method. Also, components having substantially the same functions as those of the temperature control system 1 according to the first embodiment shown in FIG. 4 are denoted by the same reference numerals and a repeated explanation thereof will not be given.

As shown in FIG. 9, the temperature control system 2 according to the second embodiment includes a plurality of the processing chambers 100, a plurality of the sub chillers 500 corresponding in a one-to-one manner to the processing chambers 100, and the chiller 400 which is commonly used for the plurality of sub chillers 500. Each of the sub chillers 500 sends a coolant whose temperature is adjusted to its corresponding processing chamber 100 based on a control signal sent from the apparatus system 300. In the second embodiment, the processing chambers 100 are installed on a second floor of a semiconductor manufacturing facility, the chiller 400 which is sub-equipment is installed on a first floor of the semiconductor manufacturing facility, and the sub chillers 500 are installed on the second floor on which the processing chambers 100 are installed. Accordingly, distances between the sub chillers 500 and the processing chambers 100 can be reduced, thereby improving responsiveness of the semiconductor wafer W and the F/R to temperature control.

Also, as shown in FIG. 9, although one chiller 400 is provided for the plurality of processing chambers 100 in the second embodiment, since the processing chambers 100 and the sub chillers 500 correspond to each other in a one-to-one manner, there is no case where a temperature of the coolant cannot be adjusted. Also, although the sub chillers 500 are installed on the same floor as the processing chambers 100 in FIG. 9, the sub chillers 500 and the processing chambers 100 do not need to be installed on the same floor as long as distances between the processing chambers 100 and the sub chillers 500 corresponding to each other can be equal to or less than 2 m (for example, the sub chillers 500 and the processing chambers 100 may be installed on a mezzanine or the like). Also, although only one chiller 400 is provided for the plurality of sub chillers 500 in FIG. 9, a plurality of the chillers 400 may be provided to respectively correspond to the sub chillers 500.

Third Embodiment

Figure 10:
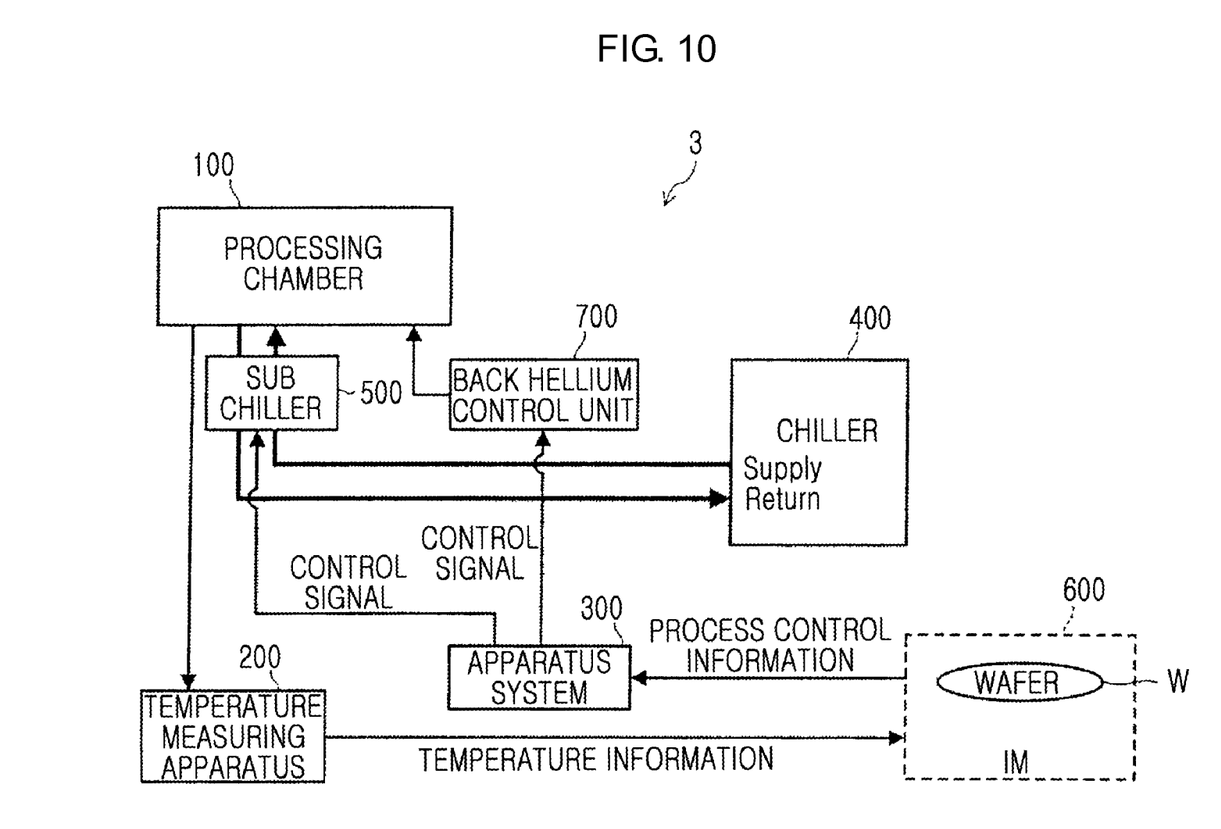
FIG. 10 is a diagram showing a configuration of a temperature control system according to a third embodiment.

FIG. 10 is a diagram showing a configuration of a temperature control system 3 according to a third embodiment. The temperature control system 3 according to the third embodiment includes the processing chamber 100, the temperature measuring apparatus 200, the apparatus system 300, the chiller 400 (first temperature adjusting unit), the sub chiller 500 (second temperature adjusting unit), an integrated metrology (IM) apparatus 600, and a back helium control unit 700. When the configuration of the temperature control system 3 according to the third embodiment is explained below, components having substantially the same functions as those of the temperature control system 1 according to the first embodiment shown in FIG. 4 are denoted by the same reference numerals and a detailed explanation thereof will not be given.

The temperature control system 3 according to the third embodiment transmits temperature information of the semiconductor wafer W and the F/R measured by the temperature measuring apparatus 200 to the IM apparatus 600 instead of the apparatus system 300. The IM apparatus 600 is an apparatus for adjusting characteristics of the semiconductor wafer W (process characteristics of the processing chamber 100, such as a film thickness and defects) which is completely processed in the processing chamber 100.

After obtaining the characteristics of the semiconductor wafer W which is completely processed in the processing chamber 100, the IM apparatus 600 orders the apparatus system 300 to change process parameters of the processing chamber 100 (such as flow rates of various gases, a pressure in the chamber, radio frequency (RF) power, a back helium pressure, and a setting temperature of the chiller) according to the obtained characteristics.

The apparatus system 300 changes the process parameters of the processing chamber 100 based on the order from the IM apparatus 600. Processing precision of the semiconductor wafer W can be further improved by changing a setting temperature of the sub chiller 500 based on a process result of the IM apparatus 600.

Also, the IM apparatus 600 may be included in the temperature control system 1 according to the first embodiment, the temperature control system 1A according to the modified example of the first embodiment, and the temperature control system 2 according to the second embodiment, and a setting temperature of the chiller 400 or the sub chiller 500 may be changed according to process characteristics obtained by the IM apparatus 600.

Other Embodiment

Also, the present invention is not limited to the embodiments, and various changes in form and details may be made therein without departing from the scope of the present invention. For example, although a semiconductor wafer is exemplarily explained as an object to be processed in the embodiments, the object to be processed is not limited to the semiconductor wafer, and for example, a wafer for solar cells or a liquid crystal panel, may be used. Also, although a temperature is measured when the semiconductor wafer is etched, the present invention can be applied to any process (for example, a physical vapor deposition (PVD) process or a chemical vapor deposition (CVD) process) which needs to monitor a temperature of the semiconductor wafer during a process. Also, the temperature measuring apparatus 200 included in the temperature control systems 1 through 3 according to the first through third embodiments may be the temperature measuring apparatus 200A included in the temperature control system 1A according to the modified example of the first embodiment (see FIG. 6).

According to the present invention, a temperature control system can control a temperature of an object to be processed more precisely than in a conventional system.

While this invention has been particularly shown and described with reference to exemplary embodiments thereof, it will be understood by those skilled in the art that various changes in form and details may be made therein without departing from the spirit and scope of the invention as defined by the appended claims.

What is claimed is:
1. A temperature control system comprising:
   a susceptor which allows an object to be processed to be held on a top surface thereof and comprises a flow path, through which a temperature adjusting medium flows, formed therein;
   a chiller which adjusts a temperature of the temperature adjusting medium flowing through the flow path;
   a sub-chiller which is disposed between the susceptor and the chiller, is separated from the chiller, and further adjusts a temperature of the temperature adjusting medium based on a temperature of the object held on the top surface of the susceptor;
   a forward flow path disposed between the chiller and the sub-chiller and between the sub-chiller and the susceptor, the temperature adjusting medium being supplied to the flow path of the susceptor from the chiller via the sub-chiller; and
   a return flow path disposed between the susceptor and the sub-chiller and between the sub-chiller and the chiller, the temperature adjusting medium being returned to the chiller via the sub-chiller from the flow path of the susceptor,
   wherein the temperature control system is configured to circulate the temperature adjusting medium between the chiller, the sub-chiller and the flow path through the forward flow path and the return flow path, and wherein the sub-chiller comprises:

a first temperature adjuster which adjusts a temperature of the temperature adjusting medium flowing from the chiller via the sub-chiller to the susceptor through the forward flow path, and a second temperature adjuster which adjusts a temperature of the temperature adjusting medium flowing from the susceptor via the sub-chiller to the chiller through the return flow path.

2. The temperature control system of claim 1, wherein the sub-chiller controls the first and second temperature adjusters, the first and second temperature adjusters being controlled independently from each other.

3. The temperature control system of claim 1, wherein the temperature of the object to be processed held on the top surface of the susceptor is measured by a temperature measuring unit, and the temperature measuring unit comprises:

a light source;

a transmitting unit which transmits a light from the light source to a measurement point of the object to be processed;

a light receiving unit which receives a reflected light from the measurement point; and a temperature calculating unit which measures a temperature of the object to be processed at the measurement point based on a waveform of the reflected light received by the light receiving unit.

4. The temperature control system of claim 3, further comprising:

a splitter which divides a light from the light source into a measurement light and a reference light;

a reference light reflecting unit which reflects the reference light from the splitter; and an optical path length changing unit which changes an optical path length of the reference light reflected from the reference light reflecting unit.

* * * * *